US009490149B2

(12) United States Patent
Chandrasekharan et al.

(10) Patent No.: US 9,490,149 B2
(45) Date of Patent: Nov. 8, 2016

(54) CHEMICAL DEPOSITION APPARATUS HAVING CONDUCTANCE CONTROL

(71) Applicant: Lam Research Corporation, Fremont, CA (US)

(72) Inventors: Ramesh Chandrasekharan, Portland, OR (US); Karl Leeser, West Linn, OR (US); Chunguang Xia, San Diego, CA (US); Jeremy Tucker, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 249 days.

(21) Appl. No.: 13/934,594

(22) Filed: Jul. 3, 2013

(65) Prior Publication Data
US 2015/0011095 A1    Jan. 8, 2015

(51) Int. Cl.
| H01L 21/67 | (2006.01) |
| H01L 21/02 | (2006.01) |
| C23C 16/44 | (2006.01) |
| C23C 16/455 | (2006.01) |
| C23C 16/52 | (2006.01) |

(52) U.S. Cl.
CPC ..... *H01L 21/67017* (2013.01); *C23C 16/4412* (2013.01); *C23C 16/455* (2013.01); *C23C 16/45523* (2013.01); *C23C 16/45525* (2013.01); *C23C 16/45527* (2013.01); *C23C 16/45565* (2013.01); *C23C 16/52* (2013.01); *H01L 21/0228* (2013.01)

(58) Field of Classification Search
None
See application file for complete search history.

(56) References Cited

U.S. PATENT DOCUMENTS 2,422,040 A * 6/1947 Rader ................. H02K 49/106
310/103
2,481,172 A * 9/1949 Staggs ................. H02K 49/108
222/333
2,669,668 A * 2/1954 Okulitch ............... F04D 13/024
310/104
3,055,391 A * 9/1962 Shuk et al. ............. 137/516.25
4,389,973 A * 6/1983 Suntola et al. ............... 118/725
(Continued)

FOREIGN PATENT DOCUMENTS

GB    WO 2014023971 A1 * 2/2014    ............. B01L 3/508

OTHER PUBLICATIONS

Terry M. Weathers. "NASA Contributions to Fluidic Systems: A Survey." National Aeronautics and Space Administration (NASA), Technology Utilization Office. 1972. pp. 1-7, 45-63 & 75-78.*
(Continued)

*Primary Examiner* — Rakesh Dhingra
*Assistant Examiner* — Stanislav Antolin
(74) *Attorney, Agent, or Firm* — Buchanan Ingersoll & Rooney PC

(57) ABSTRACT

A chemical deposition apparatus having conductance control, which includes a showerhead module having a faceplate and a backing plate, the showerhead module including a plurality of inlets which deliver reactor chemistries to a cavity and exhaust outlets which remove reactor chemistries, a pedestal module configured to support a substrate and which moves vertically to close the cavity between the pedestal module and an outer portion of the faceplate, and at least one conductance control assembly, which is in fluid communication with the cavity via the exhaust outlets. The at least one conductance control assembly selected from one or more of the following: a ball valve assembly, a fluidic valve, magnetically coupled rotary plates, and/or a linear based magnetic system.

31 Claims, 10 Drawing Sheets

(56) References Cited

U.S. PATENT DOCUMENTS

| | | | |
|---|---|---|---|
| 4,825,897 A * | 5/1989 | Shade | 137/271 |
| 5,014,748 A * | 5/1991 | Nogami et al. | F16K 3/085 |
| | | | 137/625.21 |
| 5,488,969 A * | 2/1996 | King et al. | 137/8 |
| 5,614,026 A * | 3/1997 | Williams | 118/723 ME |
| 6,015,590 A * | 1/2000 | Suntola et al. | 427/255.23 |
| 6,531,069 B1 * | 3/2003 | Srivastava et al. | H01J 37/32623 |
| | | | 118/723 R |
| 6,598,621 B1 * | 7/2003 | Wygnanski | F16K 31/003 |
| | | | 137/624.18 |
| 7,171,981 B2 * | 2/2007 | Shade et al. | 137/533.11 |
| 7,699,932 B2 | 4/2010 | Miller et al. | |
| 7,737,035 B1 * | 6/2010 | Lind et al. | 438/680 |
| 7,993,457 B1 * | 8/2011 | Krotov et al. | 118/719 |
| 8,282,983 B1 | 10/2012 | Kapoor et al. | |
| 2002/0076490 A1 * | 6/2002 | Chiang et al. | 427/248.1 |
| 2003/0134038 A1 * | 7/2003 | Paranjpe | 427/248.1 |
| 2004/0222395 A1 * | 11/2004 | Yee | F15C 5/00 |
| | | | 251/65 |
| 2005/0035676 A1 * | 2/2005 | Rahman et al. | B60K 6/26 |
| | | | 310/83 |
| 2006/0000511 A1 * | 1/2006 | Shade et al. | 137/533.11 |
| 2007/0095283 A1 * | 5/2007 | Galewski | 118/715 |
| 2007/0269983 A1 * | 11/2007 | Sneh | 438/689 |
| 2010/0282326 A1 * | 11/2010 | Zhu et al. | F16K 31/047 |
| | | | 137/1 |
| 2011/0017139 A1 | 1/2011 | Chiang et al. | |
| 2011/0111136 A1 | 5/2011 | Slevin et al. | |
| 2011/0256724 A1 | 10/2011 | Chandrasekharan et al. | |
| 2012/0231628 A1 | 9/2012 | Lee | |
| 2013/0032743 A1 * | 2/2013 | Fong et al. | 251/231 |
| 2013/0040460 A1 | 2/2013 | Yoon et al. | |
| 2015/0192209 A1 * | 7/2015 | Fitzgerald | B01L 3/508 |
| | | | 251/176 |

OTHER PUBLICATIONS

Terry M. Weathers. "NASA Contributions to Fluidic Systems: A Survey." National Aeronautics and Space Administration (NASA), Technology Utilization Office. 1972. pp. 1-23 & 75-78.*

Vaclav Tesar, Chapter 4—"Valves and Sophisticated Devices" in "Pressure Driven Microfluidics." 2007. Boston-London. Artech House. pp. 149-224.*

V. Tesar et al. "Valves with Flow Control by Synthetic Jets." EPJ Web of Conferences, vol. 25, 2012 (Published online: Apr. 16, 2012).*

Walter Umrath, Editor. Fundamentals of Vacuum Technology. Jun. 2007. Oerlikon Leybold Vacuum. Cologne, Germany. pp. 1-3,19, 41-46,144 & 167.*

Václav Tesar. "Valve-Less Rectification Pumps." pp. 2131-2139. in Dongqing Li, Ed. "Encyclopedia of Microfluidics and Nanofluidics." 2008. Springer-Verlag. pp. 2131-2178.*

* cited by examiner

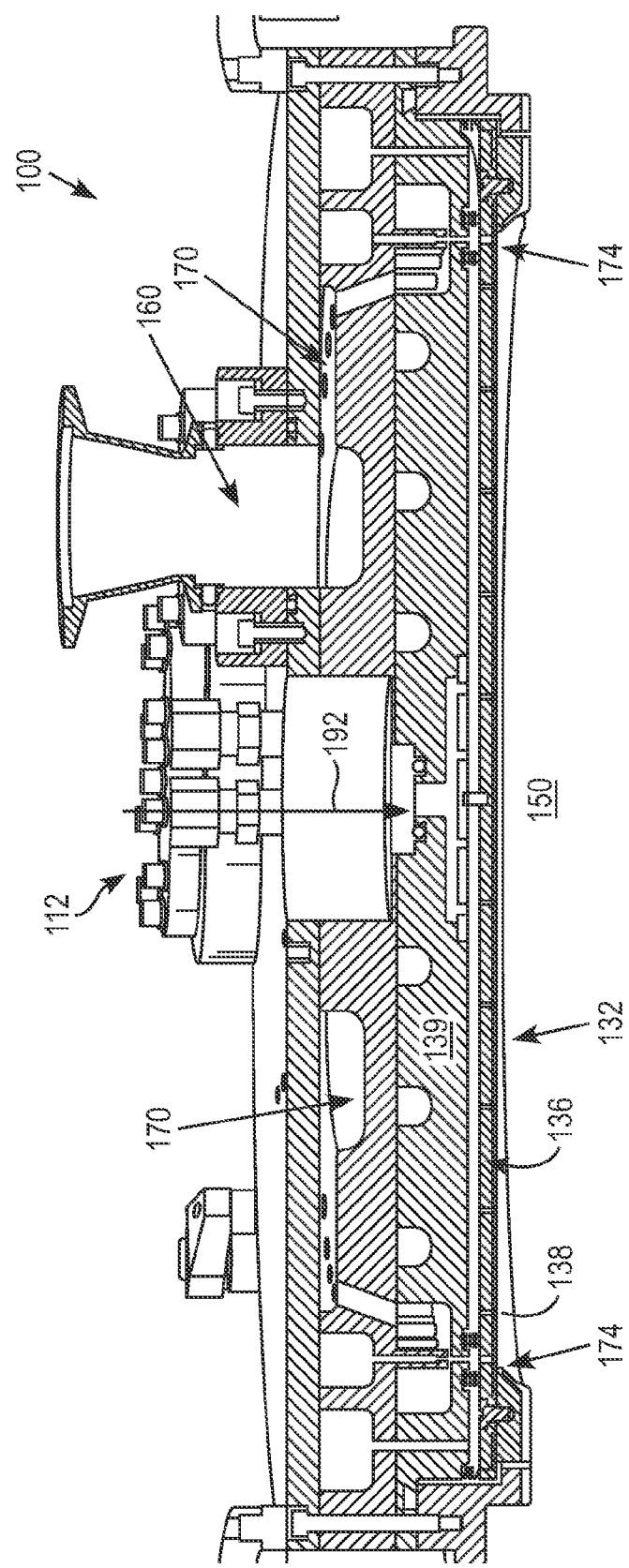

CHEMICAL DEPOSITION APPARATUS HAVING CONDUCTANCE CONTROL

FIELD OF THE INVENTION

This invention pertains to apparatuses and processes for conducting chemical depositions, and for use in conducting plasma enhanced chemical depositions.

BACKGROUND

Plasma processing apparatuses can be used to process semiconductor substrates by techniques including etching, physical vapor deposition (PVD), chemical vapor deposition (CVD), plasma enhanced chemical vapor deposition (PECVD), atomic layer deposition (ALD), plasma enhanced atomic layer deposition (PEALD), pulsed deposition layer (PDL), plasma enhanced pulsed deposition layer (PEPDL) processing, and resist removal. For example, one type of plasma processing apparatus used in plasma processing includes a reaction or deposition chamber containing top and bottom electrodes. A radio frequency (RF) power is applied between the electrodes to excite a process gas or reactor chemistries into a plasma for processing semiconductor substrates in the reaction chamber.

SUMMARY

A chemical deposition apparatus is disclosed, comprising: a chemical isolation chamber; a deposition chamber formed within the chemical isolation chamber; a showerhead module having a faceplate and a backing plate, the showerhead module including a plurality of inlets which deliver reactor chemistries to a cavity and exhaust outlets which remove reactor chemistries; and at least one conductance control assembly, which is in fluid communication with the cavity via the exhaust outlets and an evacuation apparatus fluidly connected to the at least one conductance control assembly by the one or more evacuation vacuum lines, the at least one conductance control assembly selected from one or more of the following: (a) a ball valve assembly, the ball valve assembly comprising: a housing having a conical lower portion; a conduit extending from the conical lower portion of the housing to one or more of the exhaust outlets of the cavity, the conduit having an inlet and an outlet; and a spherical body configured to fit within the conical lower portion, and wherein the spherical body is configured to block the outlet of the conduit and prevent a flow of the reactor chemistries through the conduit during a dosing step, and to allow the reactor chemistries and a purge gas to flow from the cavity into one or more evacuation vacuum lines upon exceeding a first pressure and flow rate within the cavity during a purging step by rising upward to provide an opening between a lower surface of the spherical body and the outlet of the conduit; (b) a fluidic valve, the fluidic valve having a modulating gas portion and a chamber outflow portion, the modulating gas portion configured to direct a stream of modulating gas from a modulating gas supply into a flow of reactor chemistries from the cavity, and wherein the stream of modulating gas modulates flow resistance experienced by the flow of the reactor chemistries from the cavity; (c) a rotary valve, the rotary valve comprising: an upper rotating plate; and a lower rotating plate magnetically coupled to the upper rotating plate, the lower rotating plate having a plurality of conduits, each of the plurality of conduits configured to receive reactor chemistries from the cavity from a corresponding evacuation conduit within the showerhead module, which is in fluid communication with one or more of the exhaust outlets; and/or (d) a magnetically coupled linear valve, the magnetically coupled linear valve comprising: a magnetic housing; and a plurality of linear rods, which are configured to be magnetically raised and lower within a plurality of channels, each of the plurality of linear rods having a proximal portion, which is configured to be magnetically coupled to the magnetic housing, which raises and lowers the plurality of linear rods within the magnetic housing, and a distal end, which acts as a valve for releasing the reactor chemistries and/or the purge gas from the exhaust outlets.

A method of controlling conductance within a cavity of a chemical deposition apparatus is disclosed, comprising: processing a substrate in the cavity of the chemical deposition apparatus, the cavity formed between a showerhead module and a substrate pedestal module configured to receive the substrate, wherein the showerhead module includes a plurality of inlets which delivers reactor chemistries to the cavity and exhaust outlets which remove reactor chemistries and purging gases from the cavity; injecting a purging gas into the cavity; and controlling a change in conductance of the cavity with at least one conductance control assembly, which is in fluid communication with the cavity via the exhaust outlets, the at least one conductance control assembly selected from one or more of the following: (a) a ball valve assembly, the ball valve assembly comprising: a housing having a conical lower portion; a conduit extending from the conical lower portion of the housing to one or more of the exhaust outlets of the cavity, the conduit having an inlet and an outlet; and a spherical body configured to fit within the conical lower portion, and wherein the spherical body is configured to block the outlet of the conduit and prevent a flow of the reactor chemistries through the conduit during a dosing step, and to allow the reactor chemistries and a purge gas to flow from the cavity into one or more evacuation vacuum lines upon exceeding a first pressure and flow rate within the cavity during a purging step by rising upward to provide an opening between a lower surface of the spherical body and the outlet of the conduit; (b) a fluidic valve, the fluidic valve having a modulating gas portion and a chamber outflow portion, the modulating gas portion configured to direct a stream of modulating gas from a modulating gas supply into a flow of reactor chemistries from the cavity, and wherein the stream of modulating gas modulates flow resistance experienced by the flow of the reactor chemistries from the cavity; (c) a rotary valve, the rotary valve comprising: an upper rotating plate; and a lower rotating plate magnetically coupled to the upper rotating plate, the lower rotating plate having a plurality of conduits, each of the plurality of conduits configured to receive reactor chemistries from the cavity from a corresponding evacuation conduit within the showerhead module, which is in fluid communication with one or more of the exhaust outlets; and/or (d) a magnetically coupled linear valve, the magnetically coupled linear valve comprising: a magnetic housing; and a plurality of linear rods, which are configured to be magnetically raised and lower within a plurality of channels, each of the plurality of linear rods having a proximal portion, which is configured to be magnetically coupled to the magnetic housing, which raises and lowers the plurality of linear rods within the magnetic housing, and a distal end, which acts as a valve for releasing the reactor chemistries and/or the purge gas from the exhaust outlets.

BRIEF DESCRIPTION OF THE DRAWING FIGURES

FIG. 1B illustrates a schematic diagram showing a chemical deposition apparatus without a pedestal in accordance with an exemplary embodiment.

DETAILED DESCRIPTION

Figure 1A:
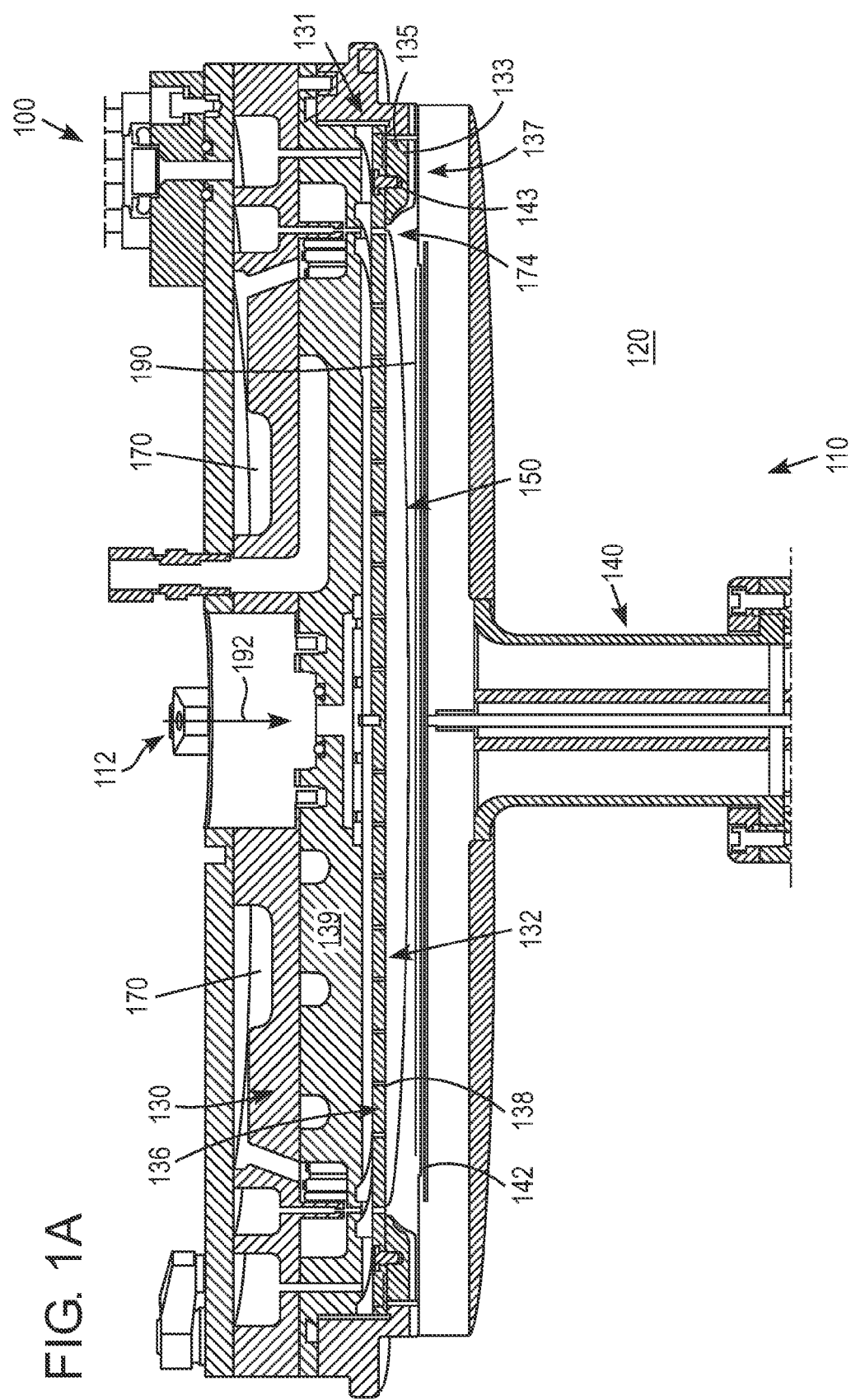
FIG. 1A illustrates a schematic diagram showing a chemical deposition apparatus with a pedestal in accordance with an exemplary embodiment.

In the following detailed disclosure, exemplary embodiments are set forth in order to provide an understanding of the apparatus and methods disclosed herein. However, as will be apparent to those skilled in the art, that the exemplary embodiments may be practiced without these specific details or by using alternate elements or processes. In other instances, known processes, procedures, and/or components have not been described in detail so as not to unnecessarily obscure aspects of embodiments disclosed herein.

In accordance with an exemplary embodiment, the apparatuses and associated methods disclosed herein can be used for conducting a chemical deposition such as a plasma enhanced chemical deposition. The apparatus and methods can be used in conjunction with a semiconductor fabrication based dielectric deposition process that requires separation of self-limiting deposition steps in a multi-step deposition process (for example, atomic layer deposition (ALD), plasma enhanced atomic layer deposition (PEALD), pulsed deposition layer (PDL), or plasma enhanced pulsed deposition layer (PEPDL) processing), however they are not so limited.

As indicated, present embodiments provide apparatus and associated methods for conducting a chemical deposition such as a plasma enhanced chemical vapor deposition. The apparatus and methods are particularly applicable for use in conjunction with semiconductor fabrication based dielectric deposition processes which require separation of self-limiting deposition steps in a multi-step deposition process (e.g., atomic layer deposition (ALD), plasma enhanced atomic layer deposition (PEALD), plasma enhanced chemical vapor deposition (PECVD), pulsed deposition layer (PDL), or plasma enhanced pulsed deposition layer (PEPDL) processing), however they are not so limited.

The aforementioned processes can suffer from some drawbacks associated with nonuniform temperatures across a wafer or substrate receiving deposited material. For example, nonuniform temperatures may develop across a substrate when a passively heated showerhead, which is in thermal contact with surrounding chamber components, loses heat to the surrounding components. Therefore, the showerhead which forms an upper wall of a processing zone is preferably thermally isolated from the surrounding components such that an isothermal processing zone may be formed, thereby forming uniform temperatures across the substrate. The uniform temperatures across the substrate aid in the uniform processing of substrates wherein the substrate temperature provides activation energy for the deposition process and is therefore a control means for driving the deposition reaction.

Further, there are generally two main types of deposition showerheads, the chandelier type and the flush mount. The chandelier showerheads have a stem attached to the top of the chamber on one end and the face plate on the other end, resembling a chandelier. A part of the stem may protrude the chamber top to enable connection of gas lines and RF power. The flush mount showerheads are integrated into the top of a chamber and do not have a stem. Present embodiments can pertain to a flush mount type showerhead wherein the flush mount showerhead reduces chamber volume which must be evacuated by a vacuum source during processing.

FIGS. 1A and 1B are schematic diagrams showing a chemical deposition apparatus 100 in accordance with embodiments disclosed herein. As shown in FIGS. 1A and 1B, the chemical apparatus includes a chemical isolation chamber or housing 110, a deposition chamber 120, a showerhead module 130, and a moving pedestal module 140 that can be raised or lowered relative to the showerhead module 130 to raise and lower a substrate (or wafer) 190 position on an upper surface of the pedestal module 140. The showerhead module 130 can also be vertically raised and lowered. Reactant material gases (not shown) are introduced into the sub-chamber 120 via gas lines 112. Each of the gas lines 112 may have a corresponding accumulator, which can be isolated from the apparatus 100 using isolation valves. In accordance with an exemplary embodiment, the apparatus 100 can be modified to have one or more gas lines 112 with isolation valves and accumulators, depending on the number of reactant gases used. Also reactant gas delivery lines 112 can be shared between a plurality of chemical deposition apparatuses or multi-station system.

In accordance with an exemplary embodiment, the chamber 120 can be evacuated through one or more vacuum lines 160 that are connected to a vacuum source (not shown). For example, the vacuum source can be a vacuum pump (not shown). In multi-station reactors, for example, those having multiple stations or apparatuses 100 that perform the same deposition process, a vacuum line 160 from another station may share a common foreline (e.g., vacuum line between vacuum pumps) with the vacuum line 160. In addition, the apparatus 100 can be modified to have one or more vacuum lines 160 per station or apparatus 100.

In accordance with an exemplary embodiment, a plurality of evacuation conduits 170 can be configured to be in fluid communication with one or more exhaust outlets 174 within the faceplate 136 of the showerhead module 130. The exhaust outlets 174 can be configured to remove process gases or reactor chemistries 192 from the cavity 150 between deposition processes. The plurality of evacuation conduits 170 are also in fluid communication with the one or more vacuum lines 160. The evacuation conduits 170 can be spaced circumferentially around the substrate 190 and may be evenly spaced. In some instances, the spacing of plurality of conduits 170 may be designed to compensate for the locations of the vacuum lines 160. Because there are generally fewer vacuum lines 160 than there are plurality of conduits 170, the flow through the conduit 170 nearest to a vacuum line 160 may be higher than one further away. To ensure a smooth flow pattern, the conduits 170 may be spaced closer together if they are further away from the vacuum lines 160. An exemplary embodiment of a chemical deposition apparatus 100 including a plurality of conduits 170 including a variable flow conductor can be found in commonly assigned U.S. Pat. No. 7,993,457, which is hereby incorporated by reference in its entirety.

Embodiments disclosed herein are preferably implemented in a plasma enhanced chemical deposition apparatus (i.e. PECVD apparatus, PEALD apparatus, or PEPDL apparatus). Such an apparatus may take different forms wherein the apparatus can include one or more chambers or "reactors" (sometimes including multiple stations, or deposition chambers as described above) that house one or more substrates and are suitable for substrate processing. Each chamber may house one or more substrates for processing. The one or more chambers maintain the substrate in a defined position or positions (with or without motion within that position, e.g. rotation, vibration, or other agitation). In one embodiment, a substrate 190 undergoing deposition and treatment can be transferred from one station (e.g. deposition chamber) to another within the apparatus during the process. While in process, each substrate 190 is held in place by a pedestal module 140, wafer chuck and/or other wafer holding apparatus. For example, for operations in which the substrate 190 is to be heated, the apparatus 100 may include a heater such as a heating plate.

The pedestal module 140 is lowered to receive and/or discharge a substrate or wafer from an upper surface of the pedestal module 140. In the lower position, a substrate is placed on the surface of the pedestal module 140, which is then raised vertically upward towards the showerhead module 130. In accordance with an exemplary embodiment, the distance between an upper surface 142 of the pedestal module 140 and a lower surface 132 of the showerhead module 130, which forms a cavity 150 can be about 0.2 inches (5 millimeters) to about 0.6 inches (15.25 millimeters).

In accordance with an exemplary embodiment, the showerhead module 130 is configured to deliver reactor chemistries to the cavity (or reactor chamber) 150. The showerhead module 130 can include a faceplate 136 having a plurality of inlets or through holes 138 and a backing plate 139. In accordance with an exemplary embodiment, the faceplate 136 can be a single plate having a plurality of inlets or through holes 138 and the step 135, which extends around the outer periphery 137 of the faceplate 136. Alternatively, the step 135 can be a separate ring 133, which is secured to a lower surface of an outer portion 131 of the faceplate 136. For example, the step 135 can be secured to the outer portion 131 of the faceplate 136 with a screw 143. An exemplary embodiment of a showerhead module 130 for distribution of process gases including a faceplate 136 having concentric exhaust outlets 174 can be found in commonly assigned U.S. Pat. No. 5,614,026, which is hereby incorporated by reference in its entirety. For example, in accordance with an exemplary embodiment, the exhaust outlets 174 surround the plurality of inlets 138.

In an exemplary embodiment, the temperature inside the chamber 120 can be maintained through a heating mechanism in the showerhead module 130 and/or the pedestal module 140. For example, the substrate 190 can be located in an isothermal environment wherein the showerhead module 130 and the pedestal module 140 are configured to maintain the substrate 190 at a desired temperature. For example, in an exemplary embodiment, the showerhead module 130 can be heated to greater than 250° C., and/or the pedestal module 140 can be heated to greater than 250° C. The deposition chamber 120 serves to contain the plasma generated by a capacitively coupled plasma type system including the showerhead module 130 working in conjunction with the pedestal module 140.

RF source(s), such as a high-frequency (HF) RF generator, connected to a matching network (not shown), and a low-frequency (LF) RF generator are connected to showerhead module 130. The power and frequency supplied by matching network is sufficient to generate a plasma from the process gas/vapor. In a preferred embodiment, both the HF generator and the LF generator are used. In a typical process, the HF generator is operated generally at frequencies of about 2-100 MHz; in a preferred embodiment at 13.56 MHz. The LF generator is operated generally at about 50 kHz to 2 MHz; in a preferred embodiment at about 350 to 600 kHz. The process parameters may be scaled based on the chamber volume, substrate size, and other factors. For example, power outputs of LF and HF generators are typically directly proportional to the deposition surface area of the substrate. For example, the power used on 300 mm wafers will generally be at least 2.25 higher than the power used for 200 mm wafers. Similarly, the flow rates, such as standard vapor pressure, will depend on the free volume of the vacuum chamber or deposition chamber 120.

Within the deposition chamber 120, the pedestal module 140 supports the substrate 190 on which materials may be deposited. The pedestal module 140 typically includes a chuck, a fork, or lift pins to hold and transfer the substrate during and between the deposition and/or plasma treatment reactions. The pedestal module 140 may include an electrostatic chuck, a mechanical chuck, or various other types of chuck as are available for use in the industry and/or research. The pedestal module 140 can be coupled with a heater block for heating the substrate 190 to a desired temperature. Generally, the substrate 190 is maintained at a temperature of about 25° C. to 500° C. depending on the material to be deposited.

In accordance with an exemplary embodiment, the deposition chamber 120 includes one or more conductance control assemblies 200, which are configured to control and regulate chamber pressure within the deposition chamber 120 during flow of process material gas or reactor chemistries (e.g., a dosing step) and a reaction or plasma step (e.g., reaction step), which causes a film to form on the wafer or substrate 190, and evacuation or purging (e.g., a purging step) of the process material gases or reactor chemistries. In accordance with an exemplary embodiment, the evacuation or purging of the chamber 120 uses an inert or purge gas. For example, as shown in FIGS. 2-9, the conductance control assemblies 200, can include one or more ball valve assemblies 300 (FIGS. 2 and 3), one or more fluidic valves 400 (FIGS. 4 and 5), and/or one or more rotary, azimuthal, and/or linear valves 500, 600 (FIGS. 6-9) as disclosed herein. In accordance with an exemplary embodiment, the plurality of exhaust conduits 170 can be located either axially and/or above to the substrate 190 and can include one or more conduits and/or channels, which are in fluid connection with the conductance control assemblies 200. In accordance with an exemplary embodiment, the plurality of exhaust conduits 170 are connected to the vacuum lines 160 via a conduit or path around and/or below an edge of the substrate 190 on the pedestal module 140. In accordance with an exemplary embodiment, for example, the one or more conductance assemblies 200 can have minimum to maximum conductance ranges by three (3) orders of magnitude.

Figure 2:
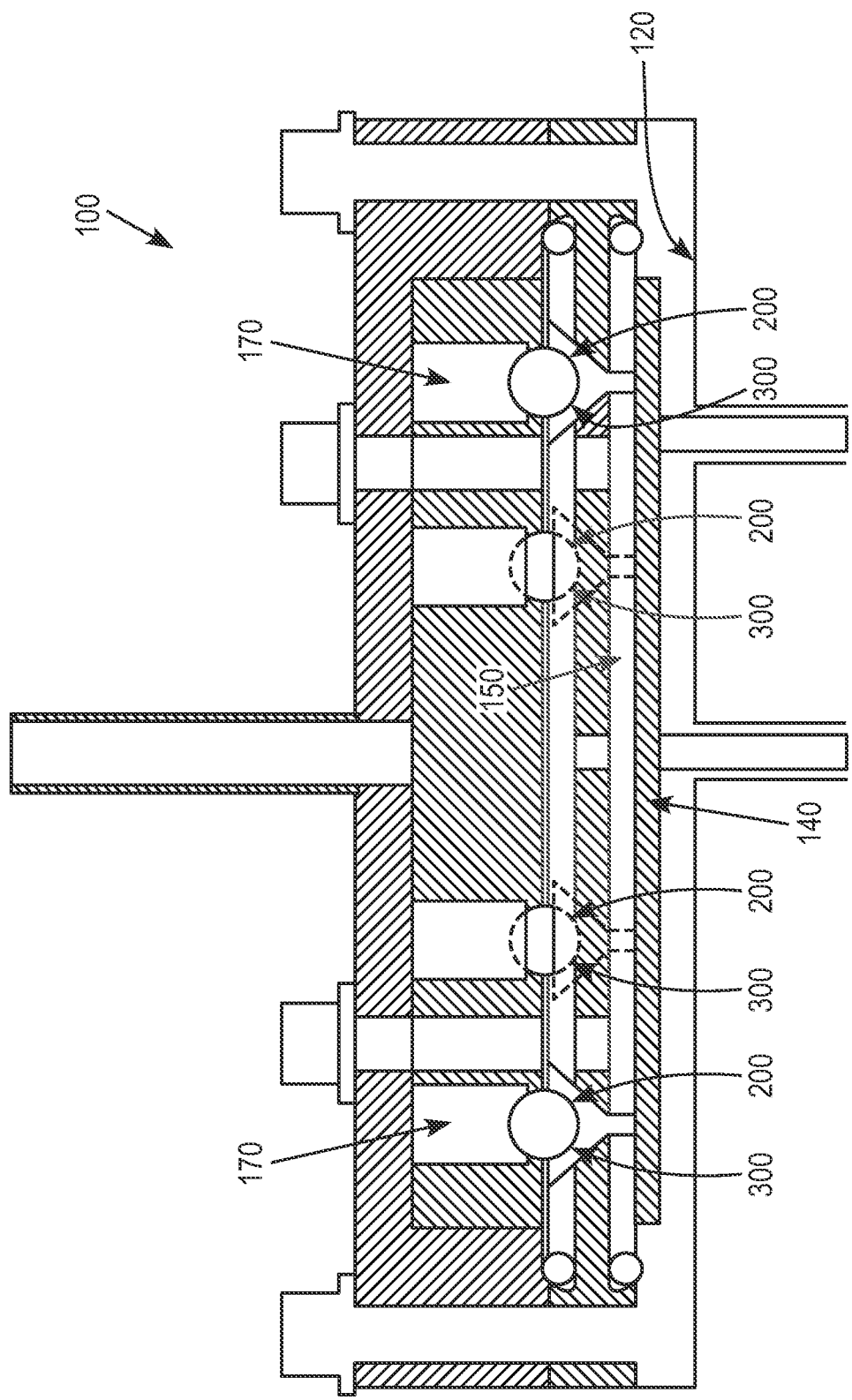
FIG. 2 illustrates a schematic diagram of an apparatus with a plurality of conductance control assemblies in accordance with an exemplary embodiment.

FIG. 2 illustrates a schematic diagram of the chemical deposition apparatus 100 having a plurality of conductance control assemblies 200 in accordance with an exemplary embodiment. As shown in FIG. 2, the chemical deposition apparatus 100 includes a chemical isolation chamber or housing 110, a deposition chamber 120, a showerhead module 130, a moving pedestal module 140 that can be raised or lowered relative to the showerhead module 130 to raise and lower a substrate or wafer (not shown) position on an upper surface of the pedestal module 140, and a plurality of conductance control assemblies 200. The plurality of conductance control assemblies 200 can be symmetrically placed around an outer edge of the showerhead module 130 and are fluidly connected to the deposition chamber 120 to one or more vacuum lines 160. In accordance with an exemplary embodiment, the plurality of conductance control assemblies 200 can be configured to provide a chemical deposition apparatus 100 having a low conductance of process material gas during deposition and a high conductance during evacuation or purging of the reactor chemistries.

In accordance with an exemplary embodiment, the showerhead module 130 can include a faceplate 136 having a plurality of through holes or inlets 138 and an outer row of concentric exhaust outlets 174, a backing plate 139 and a top plate 145. An exemplary embodiment of a showerhead 130 for distribution of process gases including a faceplate 136 having concentric exhaust outlets 174 can be found in commonly assigned U.S. Pat. No. 5,614,026, which is hereby incorporated by reference in its entirety. In accordance with an exemplary embodiment, an exhaust passage 440 (FIG. 5) connects the exhaust outlets 174 to an exhaust conduit 426 in the backing plate 139 and/or a top plate 145 above the backing plate 139 (not shown). In accordance with an exemplary embodiment, each exhaust gas passage 440 can include a conductance control assembly 200, (one ball per passage, one jet of purge gas per passage, one variable zone along a gas passage).

For example, if the module has two vacuum connections 160 and two exhaust conduits 170, there could be a number of exhaust outlets 174 in the faceplate 136 in fluid communication with each exhaust conduit 170. For example, the plurality of conductance control assemblies 200 can be between 2 and 10, more preferably 4 to 8, and most preferably 6 for an apparatus 100, wherein each of the plurality of conductance control assemblies 200 is fluidly connected to two or more exhaust outlets 174 within the faceplate 136, for example, 2 to 20 exhaust outlets 174 for each of the plurality of conductance control assemblies 200. In another embodiment, each of the plurality of conductance control assemblies 200 can be fluidly connected to a single exhaust outlet 174 within faceplate 136 of the showerhead module 130, for example, the showerhead module can include 10 to 120 conductance control assemblies 200, and more preferably 20 to 80 conduction control assemblies 200.

Figure 3:
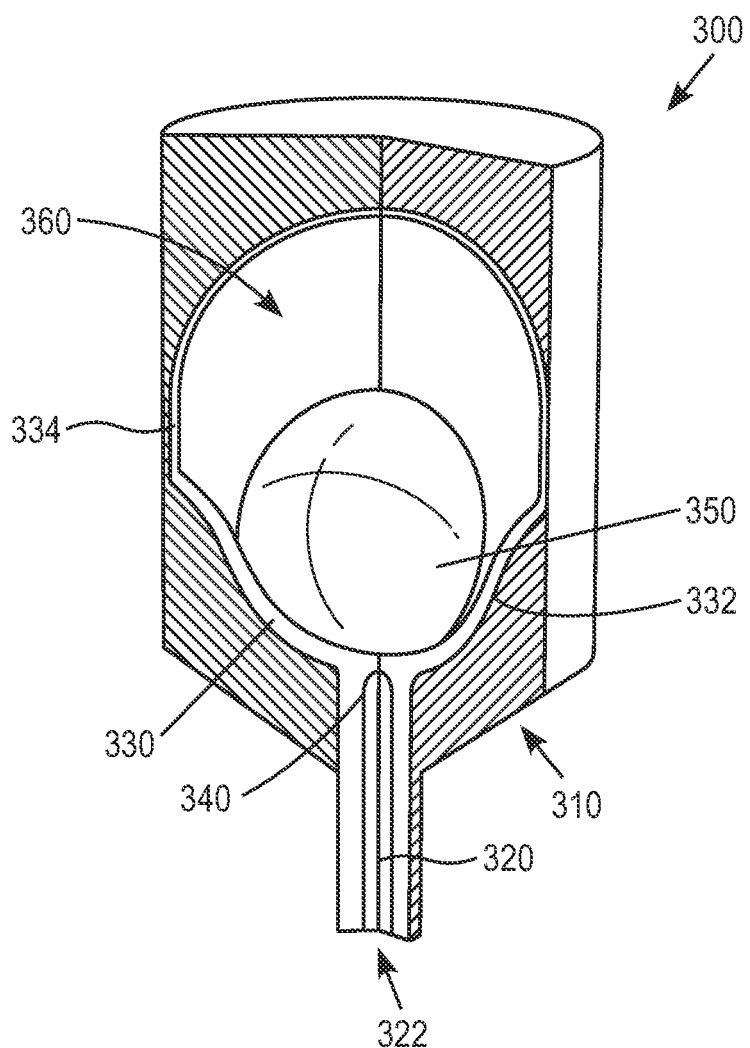
FIG. 3 illustrates a partial view of a ball valve assembly in accordance with an exemplary embodiment.

FIG. 3 illustrates a partial view of a conductance control assembly in the form of a ball valve assembly 300 in accordance with an exemplary embodiment. As shown in FIG. 3, the ball valve assembly 300 includes a housing 310 having a conduit 320 in fluid communication with the cavity 150, a housing 330 having a conical portion 332 on a lower portion thereof and cylindrical housing 334 on an upper portion thereof. The conical portion 332 has an outlet or opening 340 on a lower portion thereof, which is in fluid communication with the conduit 320. In accordance with an exemplary embodiment, an upper portion or outlet 360 of the housing 330 is in fluid communication with one or more vacuum lines 160.

In accordance with an exemplary embodiment, a cylindrical ball or spherical body 350 is located within the cylindrical housing 330 and is configured to rest within the conical portion 332 of the housing 330. Each of the balls or spherical bodies 350 based on their weight and/or size are configured to block the outlet or opening 340, at or below a first pressure and flow rate within the cavity 150 and upon exceeding the first pressure and flow rate, the one or more of the balls or spherical bodies 350 will begin to float or raise upward providing an opening between a lower surface of the ball or spherical body 350 and the outlet or opening 340 to allow reactor chemistries and/or purge gas to flow from the cavity 150 into the one or more vacuum lines 160. For example, during the dosing step or process, the pressure and flow rate of the reactor chemistries and/or purge gas within the cavity 150 can be low enough that the spherical bodies 350 do not move or rise upward allowing the reactor chemistries to be confined within the cavity 150. However, during the purging step, the pressure within the cavity 150 in combination with the flow rate of the purging gas into the cavity 150 can exceed the first pressure and flow rate, which displaces the spherical bodies.

In accordance with an exemplary embodiment, the number of ball valve assemblies 300 for a given chemical deposition apparatus 100 can be between 2 and 10 based on the number of exhaust conduits 170, which can be spaced circumferentially around the substrate 190 and may be evenly spaced. In accordance with an exemplary embodiment, each of the ball valve assemblies 300 can be configured to be fluidly connected to one or more evacuation conduits (not shown), which are configured to evacuate reactor chemistries from the cavity 150 during a purging process.

The weight of the spherical bodies or balls 350 can be designed to mimic valve actuation at the purge gas flow rate. In accordance with an exemplary embodiment, each of the plurality of cylindrical balls or spherical bodies 350 is made of a corrosion resistant material, such as aluminum oxide ($Al_2O_3$), for example, a sapphire spherical body or ball. In accordance with an exemplary embodiment, each of the ball valve assemblies 300 is configured to lift upward only during purging of the cavity 150. In accordance with an exemplary embodiment, during deposition of chemical reactant gases, the spherical bodies or balls 350 remain within the conical portion 332 of the housing 330, and based on the weight and/or size of the spherical bodies or balls 350, they block the outlet or opening 340 preventing the release or flow of reactant gases into the forelines of the vacuum system. In accordance with an exemplary embodiment, an inlet 322 of the conduit 320 of the ball valve assemblies 300 is located as close as possible to the cavity 150.

In accordance with an exemplary embodiment, the number of the ball valve assemblies 300 can be between 2 and 10, more preferably 4 to 8, and most preferably 6, for an apparatus 100. Each of the plurality of ball valve assemblies 300 is fluidly connected to two or more exhaust outlets 174, for example, 2 to 20 exhaust outlets 174. In an exemplary embodiment, each of the plurality of ball valve assemblies 300 can be fluidly connected to a single exhaust outlet 174 within the faceplate 136 of the showerhead module 130, and can be 10 to 120 ball valve assemblies 300, and more preferably 20 to 80 ball valve assemblies 300.

In accordance with an exemplary embodiment, the plurality of conductance control assemblies 300 can be a gravity based mechanical check valve, for example, a spring loaded ball valve, which opens upon reaching a predetermined pressure within the cavity 150.

Figure 4:
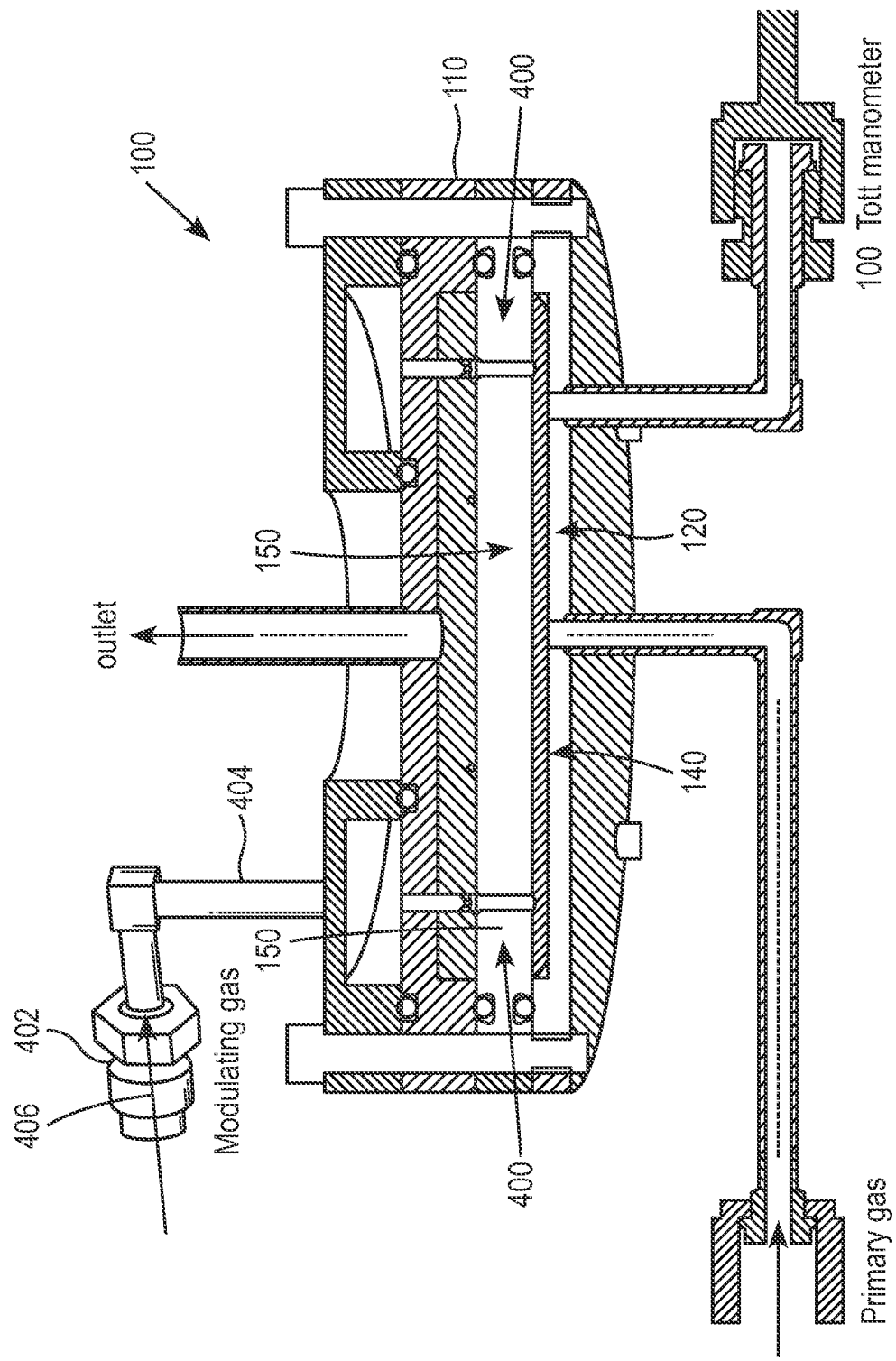
FIG. 4 illustrates a schematic diagram of a cross-sectional view of a fluidic valve in accordance with an exemplary embodiment.
Figure 5:
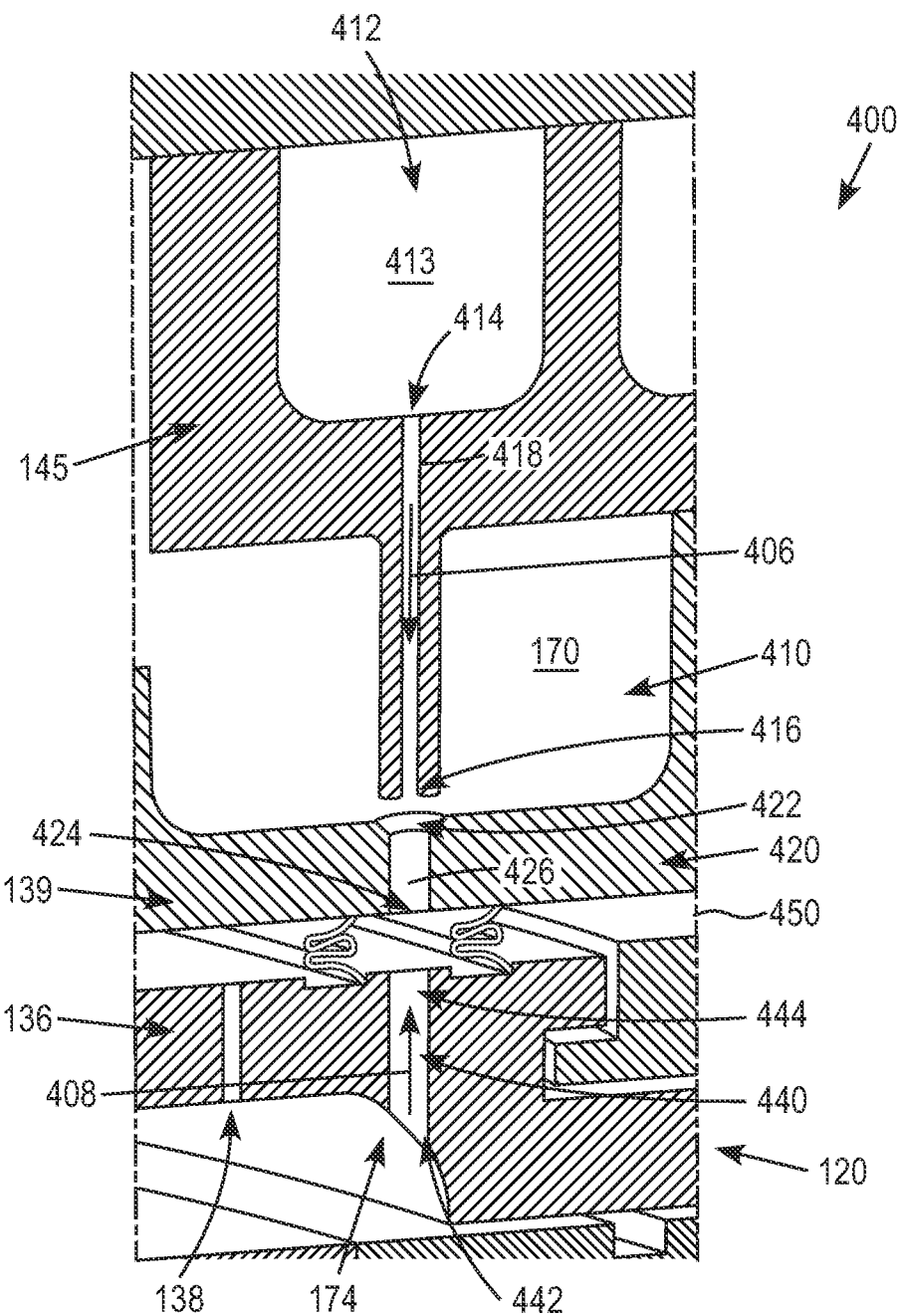
FIG. 5 illustrates a diagram of a fluidic valve in accordance with an exemplary embodiment.

FIG. 4 illustrates a schematic diagram of a cross-sectional view of a chemical deposition apparatus 100 having a conductance control assembly in the form of a fluidic valve 400 (FIG. 5). The fluidic valve 400 uses a modulating gas flow from a series of disturbed flow outlets, which are sized and placed such that the modulating flow creates a jet or stream that interacts with the flow exiting the cavity 150 creating a local pressure drop. For example, for a given modulating flow as the chamber flow rate increases at a particular point, the modulating flow jet is distributed and transition point occurs after which the presence of the modulating flow does not contribute to the overall pressure drop at the exit of the cavity 150. Hence, below the transition point, the fluidic valve 400 can be used as a flow restriction device, which enables a quick rise in pressure within the cavity 150. In addition, the cavity 150 can be purged efficiently without changing modulating flow rate, which permits a faster rise in pressure during the processing or dosing step without sacrificing purge ability in the next step.

In accordance with an exemplary embodiment, the fluidic valves 400 can be located within a top plate 145 with purge gas conduits and tubes extending into the exhaust conduit 170 between the backing plate 139 and the top plate 145 with jets of modulating gas opposing gas flow out of exhaust passages in backing plate 139. In accordance with an exemplary embodiment, the reactor chemistries 192 in the form of an exhaust gas travels from the exhaust outlet 174 in faceplate 136 through a plenum 450 between the faceplate 136 and the backing plate 139 and then out an exhaust passage 426 in the backing plate 139 at which point its flow is impeded by the opposing jet flow of the modulating gas from a modulating gas supply 402.

As shown in FIG. 4, the chemical deposition apparatus 100 includes a chemical isolation chamber or housing 110, a deposition chamber 120, a showerhead module 130, a moving pedestal module 140 that can be raised or lowered relative to the showerhead module 130 to raise and lower a substrate or wafer (not shown) positioned on an upper surface of the pedestal module 140, and a plurality of fluidic valves 400. In addition, a modulating gas or purge gas supply line 402 is connected to an upper portion of each of the fluidic valves 400.

In accordance with an exemplary embodiment, the fluidic valve 400 is incorporated into the gas or pressure control system of deposition chamber 120. The fluidic valve 400 enables conductance control locally at the exit of the deposition chamber 120 with minimal additional gas usage and minimal added volume to the cavity 150. In accordance with an exemplary embodiment, this can be achieved by the use of a modulating gas flow from a series of distributed fluidic valves 400. The outlets 416 of the fluidic valves 400 can be sized and placed such that the modulating flow creates a jet that interacts with the flow exiting from within cavity 150 creating a local pressure drop and/or conductance change.

FIG. 5 illustrates a diagram of a fluidic valve 400 in accordance with an exemplary embodiment. As shown in FIG. 5, the fluidic valve 400 includes a modulating gas portion 410 and a chamber outflow portion 420. The modulating gas portion 410 is fluidly connected to a modulating gas supply 402 via one or more conduits or gas supply lines 404. The modulating gas supply 402 supplies a modulating gas 406 preferably in for the form of an inert gas, for example, nitrogen ($N_2$) or Argon (Ar).

In accordance with an exemplary embodiment, the modulating gas portion 410 has a modulating inlet 412, which receives the modulating gas via the one or more conduits or gas supply lines 404, an inner cavity 413, at least one inlet 414 and at least one outlet 416. In accordance with an exemplary embodiment, the at least one inlet 414 and the at least one outlet 416 are cylindrical holes within the modulating gas portion 410 of the fluidic valve 400 forming a conduit 418. In accordance with an exemplary embodiment, the at least one outlet 416 has a smaller diameter than the at least one inlet 412, which focuses the modulating gas 406 and forms a jet or stream of modulating gas 406, which is in fluid communication with the reactor gas flow 408 from the wafer or chamber cavity 150. The modulating gas 406 and the reactor gas flow 408 are combined within a cavity or exhaust conduit 170, which is in fluid communication with the one or more vacuum gas lines 160.

In accordance with an exemplary embodiment, the chamber outflow portion 420 is fluidly connected to the cavity 150 and includes one or more flow conduits 426, which receives the reactor gas from the cavity 150. In accordance with an exemplary embodiment, each of the one or more flow conduits 426 has an inlet 424 and an outlet 422. The inlet 424 and the outlet 422 of the flow conduits 426 are preferably equal in diameter. In accordance with an exemplary embodiment, the inlet 424 of the one or more flow conduits 426 is fluidly connected to a recess portion 450 of the showerhead module 130. The recess portion 450 is fluidly connected to one or more conduits 440, and wherein each of the one or more conduits 440 has an inlet 442 and an outlet 444 in fluid communication with the cavity 150.

In accordance with an exemplary embodiment, the jet or stream of modulating gas 406 blocks the flow of the reactor gas flow 408 from the cavity 150, which increase the resistance and ability for the reactor gas flow 408 to escape or be released from the cavity 150. In accordance with an exemplary embodiment, as the reactor gas flow 408 increases, at a certain point, the modulating gas 406 is pushed away (for example, the jet gets disturbed by the increasing flow) and the reactor gas flow 408 encounters less resistance. In accordance with an exemplary embodiment, the transition point can be effectively modulated by adjusting or changing the flow rate of the modulating gas 406 in comparison to the flow rate of the chamber or reactor gas flow 408, dimensions of the outlet 416, and/or distance between the outlet 416 of the modulating gas portion 410 and the outlet 422 of the flow conduits (or reactor exit plane) 426.

In accordance with an exemplary embodiment, the flow rates of the modulating gas 406 and the chamber or reactor gas flow 408 can be controlled by adjusting the flow rate of the modulating gas 406 in conjunction with a size or diameter of the corresponding inlets 414, 424 and outlets 416, 422 on the modulating portion 410 and the chamber portion 420 of the fluidic valve 400. In addition, the performance of the fluidic valve 400 can be controlled or varied based on the foreline pressure of the one or more vacuum lines 160, for example, the lower foreline pressure, the better the restriction performance.

In accordance with an exemplary embodiment, the fluidic valve 400 provides the ability to reduce chemical or processing gas usage, for processes, such as ALD, and can also increase the number of substrates 190, which can be processed. In addition, the apparatus 100 with a fluidic valve 400 having a modulating gas 406 as disclosed herein can reduce the time required to increase the pressure of the cavity 150 for the dosing step. For example, throughput (i.e., the number of wafer or substrate processed in a given time frame, can be improved due to a reduction in dose time.

In accordance with an exemplary embodiment, the plurality of fluidic valves 400 are symmetrically placed around an outer edge of the showerhead module 130 and are fluidly connected to the cavity 150 and one or more vacuum lines 160 via one or more exhaust conduits 170. In accordance with an exemplary embodiment, the number of fluidic valves 400 is equal in number to the number of outlets or conduits 440 within a recess portion 430 of the showerhead module 130. For example, in an exemplary embodiment, the plurality of fluidic valves 400 can be 10 to 120 fluidic valves 400, and more preferably 20 to 80 fluidic valves 400. In accordance with an exemplary embodiment, for an apparatus 100, wherein each of the plurality of fluidic valves 400 are fluidly connected to two more evacuation conduits 440, the number of fluidic valves 400 can be for example, between 2 and 10.

Figure 6:
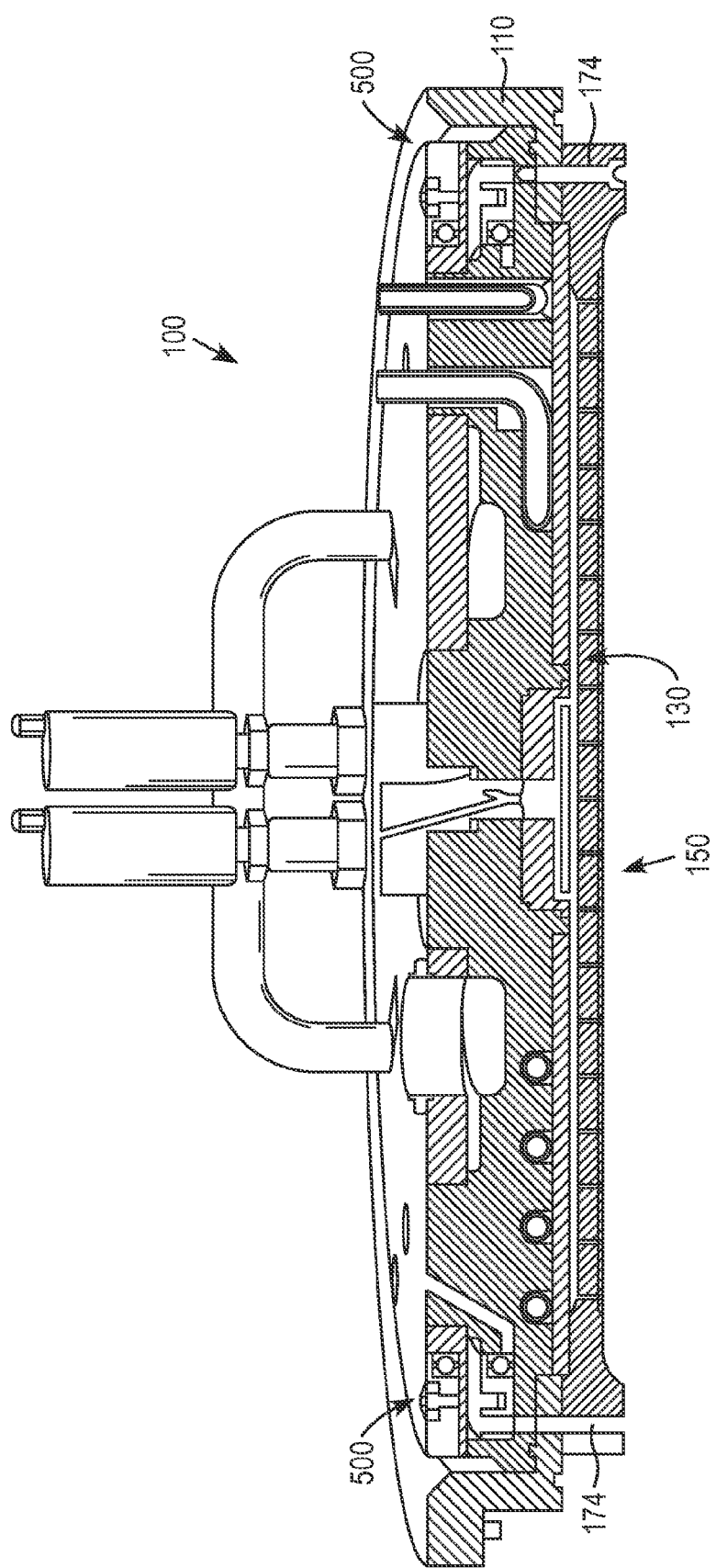
FIG. 6 illustrates a cross-sectional view of a cavity of a chemical deposition apparatus having a rotary bearing with magnetic coupling in accordance with an exemplary embodiment.

FIG. 6 illustrates a cross-sectional view of a chemical deposition apparatus 100 having a rotary or azimuthal valve 500 having a magnetic coupling in accordance with an exemplary embodiment. As shown in FIG. 6, the chemical deposition apparatus 100 includes a chemical isolation chamber or housing 110 having a cavity 150, a showerhead module 130, a moving pedestal module (not shown) that can be raised or lowered relative to the showerhead module 130 to raise and lower a substrate or wafer (not shown) position on an upper surface of the pedestal module and a rotary or azimuthal valve 500.

Figure 7:
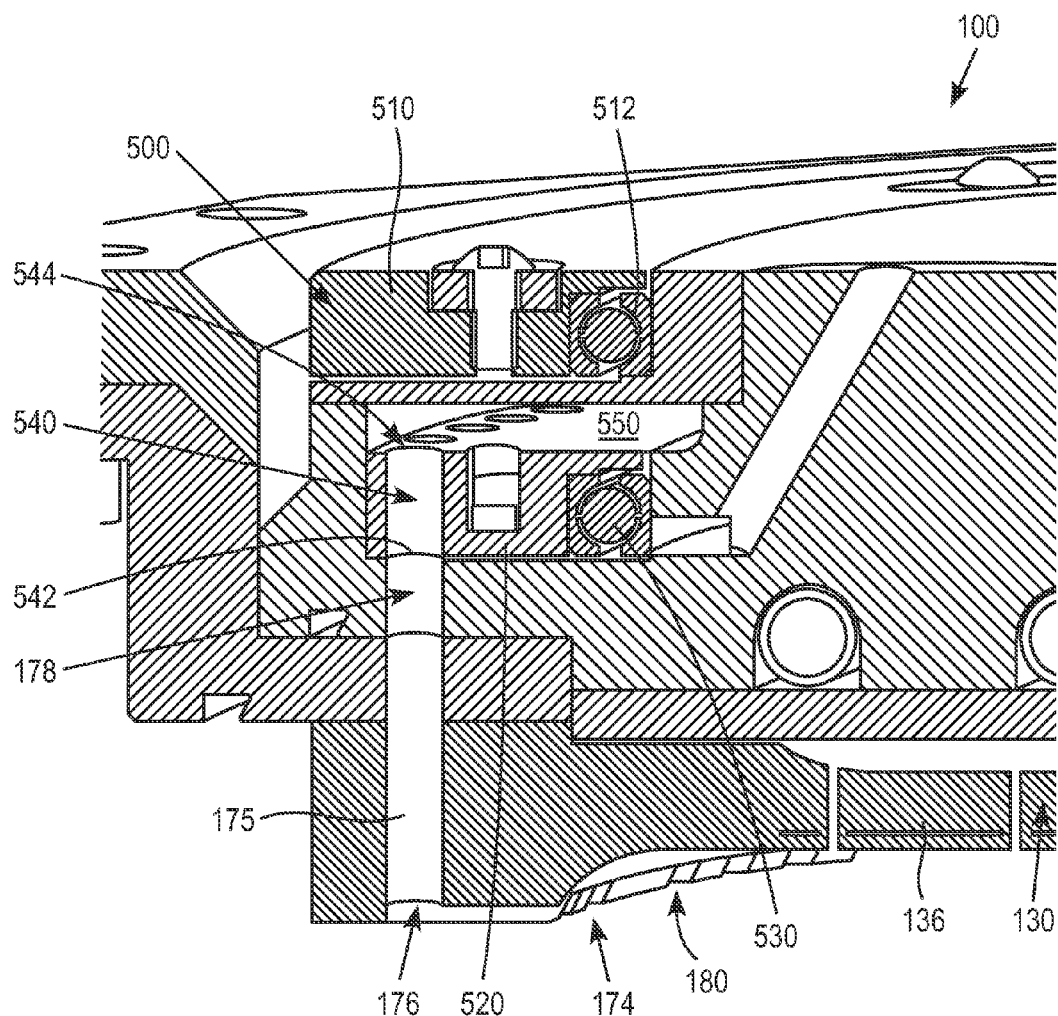
FIG. 7 illustrates a cross-sectional view of a portion of the cavity of FIG. 6 in accordance with an exemplary embodiment.

FIG. 7 illustrates a cross-sectional view of a portion of the rotary valve 500 of the chemical deposition apparatus 100 as shown in FIG. 7 in accordance with an exemplary embodiment. As shown in FIG. 7, the rotary valve 500 includes an upper rotating or azimuthal plate or ring 510 (or rotating plate in atmosphere) having at least one rotary bearing 512, for example, an X-type thin section bearing, and a lower rotating or azimuthal plate or ring 520 (or rotating plate in vacuum) having a least one rotary bearing 530. The lower rotating plate or ring 520 includes a plurality of conduits or passages 540, which is configured to receive reactor chemistries from the cavity 150 via a corresponding evacuation conduit 174. Each of the plurality of passages 540 has an inlet 542 on a lower surface and an outlet 544 on an upper surface. The outlets 544 are in fluid communication with an inner cavity or plenum 550, which is in fluid communication with the one or more vacuum gas lines 160 (not shown) via exhaust conduits 170. In accordance with an exemplary embodiment, the upper rotating plate or ring 510 of the rotary valve 500 can be driven by a flexure, or alternatively, the upper rotating plate or ring 510 can be integrated into a pulley driven plate with integrated flexure or bearing elements.

In accordance with an exemplary embodiment, each of the plurality of evacuation conduits 175 also includes an inlet 176 in fluid communication with the cavity 150 and an outlet 178, which is in fluid communication with the inlets 542 of the lower plate 520. In accordance with an exemplary embodiment, the outlets 178 are concentrically located around the cavity 150 and circumferentially spaced apart and radially extending exhaust passages 180 connect the cavity 150 to the evacuation conduits 175. The exhaust passages 180 extend from an outer edge of the cavity 150 radially outward to the plurality of evacuation conduits 175

In accordance with an exemplary embodiment, the plurality of evacuation conduits 175 can be aligned with the plurality of passages 540 in the lower plate or ring 510, such that upon rotation of the lower plate or ring 510, the alignment of the outlets 178 of the plurality of evacuation conduits 175 and the inlets 542 of the lower plate or ring 510 changes the conductance of the rotary or azimuthal plate 500. In accordance with an exemplary embodiment, the lower plate 520 acts as a local conductance control assembly or valve. The conductance at the plurality of evacuation conduits 175, for example, reactor exit, from one step or process to the next is controlled by the features of the rotating plates 510, 520, for example, the degree to which the holes or conduits 174 which constitute the reactor exit are aligned (or not) with the features or plurality of passages 540 on the reactor exit portion of the lower rotating or azimuthal plate 520.

In accordance with an exemplary embodiment, the plurality of evacuation conduits 175 and/or the plurality of passages 540 can be round holes, ovals, or other sized apertures. In accordance with an exemplary embodiment, the plurality of evacuation conduits 175 and passages 540 can number between about 60 and 120, and most preferably about 90. In addition, by changing the size and shape of the plurality of evacuation conduits 175 and the plurality of passages 540, the conductance of the rotary valve 500 can be adjusted as desired. For example, the minimum conductance can be lowered by reducing the number of conduits and holes 174, 540, the sizes of the conduits and holes 174, 540, and/or the cross-sectional shape of the conduits and holes 174, 540.

In use, upon rotation of the upper plate 510 in either a clockwise or counter clockwise direction, a corresponding rotation of the lower plate 520 occurs. The rotation of the lower plate 520 causes a change in the relative positions of the outlets 178 of the evacuation conduits 175 relative to the inlets 542 of the plurality of passages 540 within the lower plate 540. In accordance with an exemplary embodiment, the relative positions of the outlets 178 of the evacuation conduits 175 to the inlets 542 of the passages 540 controls the flow or conductance of the reactor chemistries 192 from the cavity 150. If the outlets 178 and the inlets 542 are aligned with one another, a maximum flow can occur. Alternatively, if the outlet 178 and the inlets 542 are only partially aligned, a reduced flow can occur.

In accordance with an exemplary embodiment, the upper and the lower plates 510, 520 can include an atmospheric side and vacuum side X-type bearing (for example, Kaydon® bearing) and coupling the atmospheric side magnetically to a linear transfer style motor or voice coil actuator (not shown). In accordance with an exemplary embodiment, for example, a two to three degree rotational motion of the interfacing conduits or holes 174, 540 can change the conductance from a minimum to a maximum flow for the apparatus 100. In addition, the system of rotary plates 510, 520 can be designed as needed to provide a conductance control assembly 200 having features including a desirable opening and closing speed, and frequency response, which can improve throughput for the apparatus 100. The shape and mass of the rotary plates (moment of inertia) 510, 520 can also be sized to fit within the chemical isolation chamber 110.

In accordance with an exemplary embodiment, each of the upper and the lower plates 510, 520 has a plurality of magnets (not shown), which are equally distributed about the upper and the lower plates 510, 520. In accordance with an exemplary embodiment, the plurality of magnets upon rotation of the upper plate 510 causes a corresponding rotation of the lower plate 520. In accordance with an exemplary embodiment, the plate 520 rotating in vacuum can be magnetically coupled to the plate 510 rotating on the atmospheric side, which can be driven by a rotating means or known method such as pulleys, motors, belt drives.

In accordance with an exemplary embodiment, the upper and lower plates 510, 520 can be magnetically coupled to one another, and the upper plate 510 can be driven by a screw type motion, for example, by a rotating means or known method such as pulleys, motors, belt drives, which can be useful for fast changes in conductance.

Figure 8:
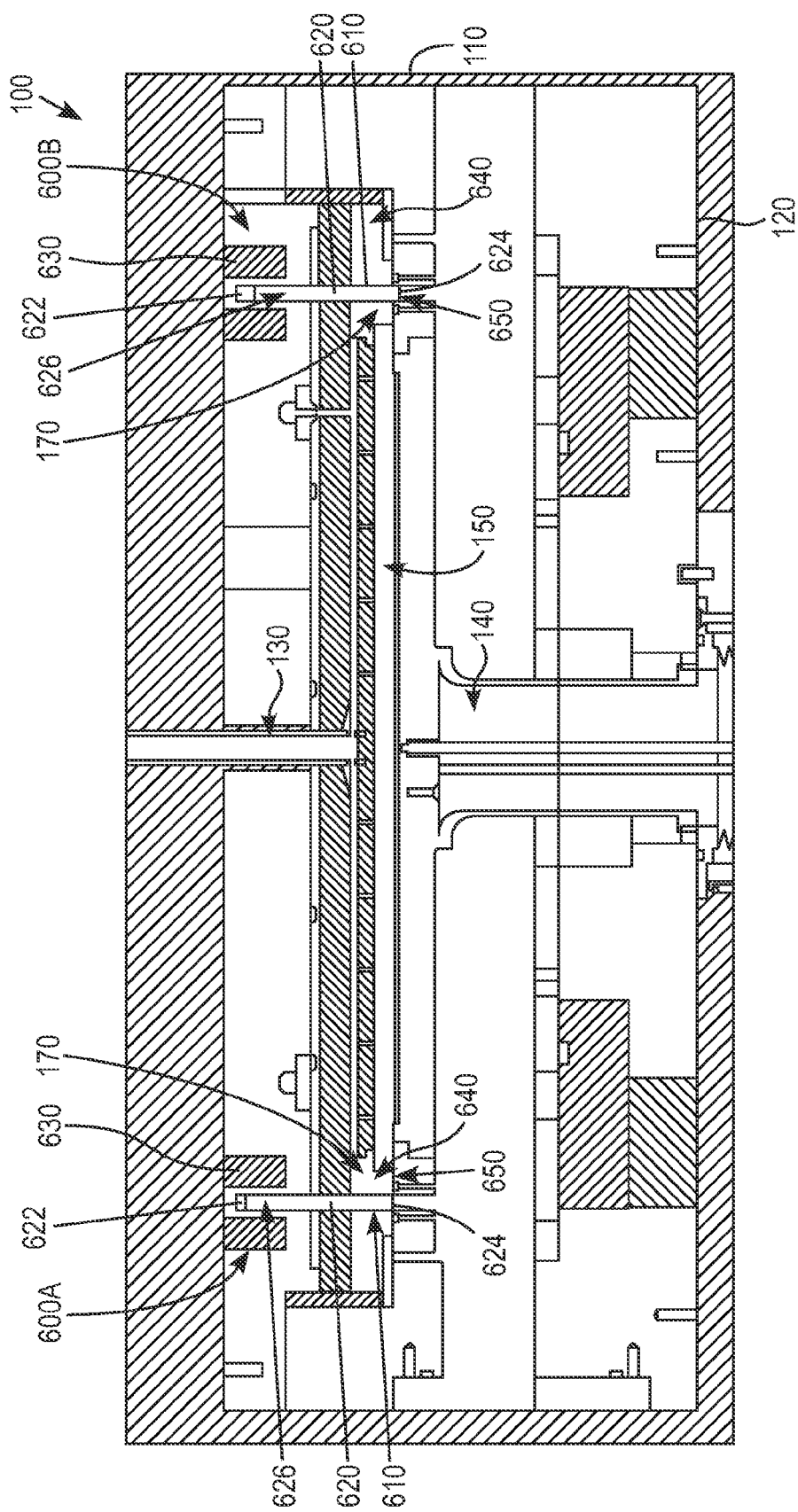
FIG. 8 illustrates a cross-sectional view of a cavity of a chemical deposition apparatus having a linear magnetic coupling based valve in an open position in accordance with an exemplary embodiment.
Figure 9:
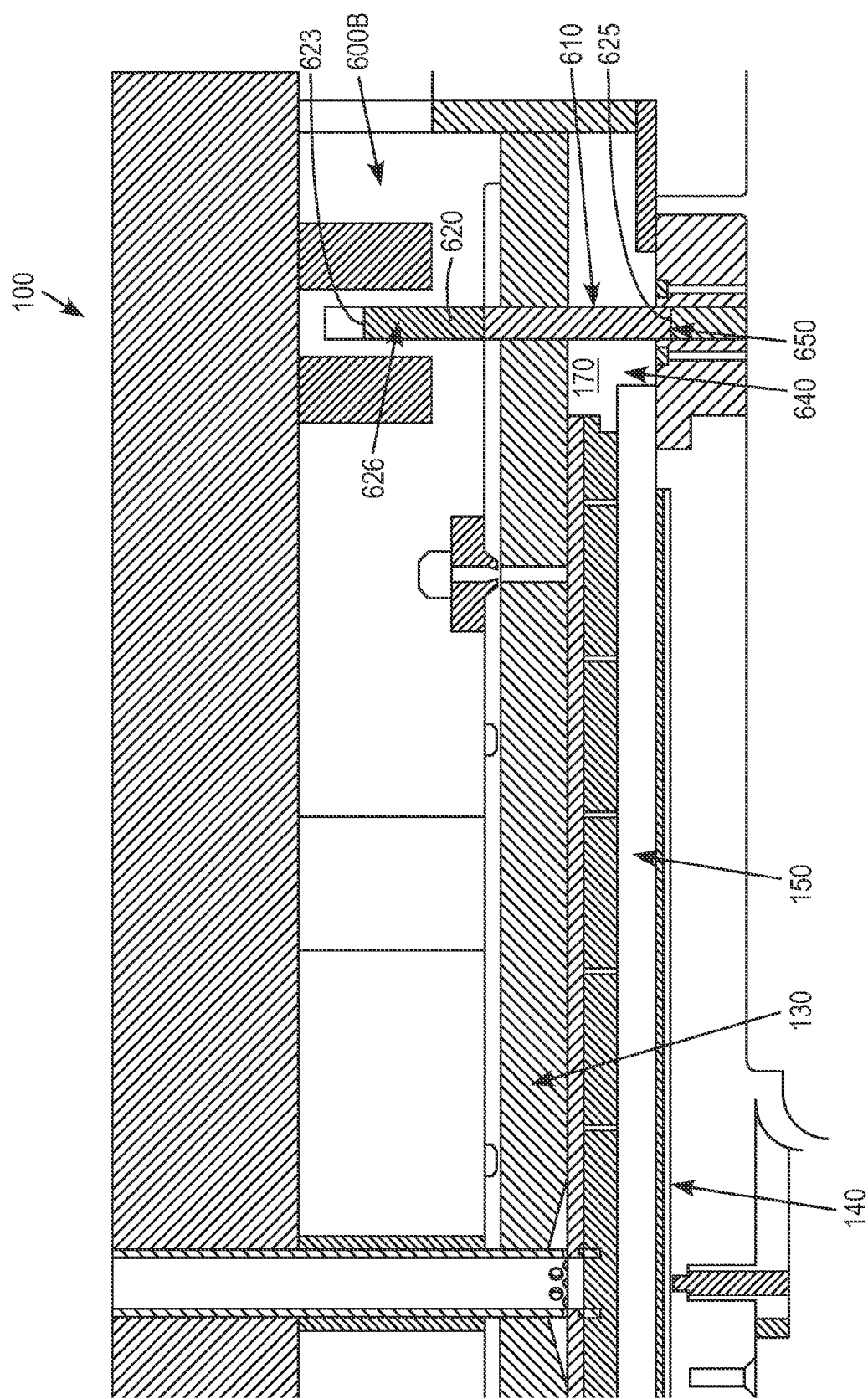
FIG. 9 illustrates a cross-sectional view of a cavity of a chemical deposition apparatus having a linear magnetic coupling based valve in a closed position in accordance with an exemplary embodiment.

FIG. 8 illustrates a cross-sectional view of a deposition chamber 120 and cavity 150 of a chemical deposition apparatus 100 having a linear magnetic coupling valve 600A, 600B in an open position (left valve 600A) and a closed position (right valve 600B) in accordance with an exemplary embodiment. As shown in FIG. 9, the linear magnetic coupling valve 600A, 600B includes a linear plate or ring 610 having a plurality of linear rods 620, which are configured to be magnetically raised and lowered within a plurality of exhaust channels 624, which are configured to act as a valve to release reactor chemistries from the cavity 150 in an open position and prevent reactor chemistries from escaping from the cavity 150 in a closed position.

In accordance with an exemplary embodiment, the plurality of exhaust channels 624 are fluidly connected to a plurality of exhaust passage 180 (FIG. 7), which are concentrically located around the cavity 150. The exhaust passages 180 extend from an outer edge of the cavity 150 radially outward to the plurality of exhaust channels 624. In accordance with an exemplary embodiment, an upper portion 622 of the each of the linear rods 620 is magnetically coupled to a magnetic housing 630. The magnetic housing 630 upon activation thereof is configured to raise and lower the plurality of linear rods 620 via magnetic coupling, which acts as a valve to release reactant gases from within the cavity 150 via the evacuation conduit 650 into the inner cavity 640. The apparatus 100 also include an exhaust conduit 170, which is in fluid communication with the cavity 150 and an inner cavity 640.

FIG. 9 illustrates a cross-sectional view of a cavity 150 of a chemical deposition apparatus 100 having a linear valve 600B in a closed position in accordance with an exemplary embodiment. As shown in FIG. 9, each of the plurality of linear rods 620 has a proximal end 623 and a distal end 625. Each of the plurality of linear rods 620 also includes a proximal portion 626, which is configured to be magnetically coupled to a magnetic housing 630, which raises and lowers the linear rods 620 within the magnetic housing 630. A distal end 625 of each of the linear rods 620 acts a choke or valve for reactor chemistries within the deposition chamber 120 and/or cavity 150. In accordance with an exemplary embodiment, upon lifting or raising the distal end 625 of each of the linear rods 620, reactor chemistries and/or purge gas is released from the deposition chamber 120 and/or cavity 150 to the inner cavity 640 via an exhaust passage 180.

Also disclosed herein is a method of processing a semiconductor substrate in a processing apparatus. The method comprises supplying reactor chemistries from the reactor chemistries source into the deposition chamber, and processing a semiconductor substrate in the plasma processing chamber. The method preferably comprises plasma processing the substrate wherein RF energy is applied to the reactor chemistries using an RF generator which generates the plasma in the deposition chamber.

When the word "about" is used in this specification in connection with a numerical value, it is intended that the associated numerical value include a tolerance of ±10% around the stated numerical value.

Moreover, when the words "generally", "relatively", and "substantially" are used in connection with geometric shapes, it is intended that precision of the geometric shape is not required but that latitude for the shape is within the scope of the disclosure. When used with geometric terms, the words "generally", "relatively", and "substantially" are intended to encompass not only features which meet the strict definitions but also features which fairly approximate the strict definitions.

While the plasma processing apparatus including an isothermal deposition chamber has been described in detail with reference to specific embodiments thereof, it will be apparent to those skilled in the art that various changes and modifications can be made, and equivalents employed, without departing from the scope of the appended claims.

What is claimed is:

1. A chemical deposition apparatus, comprising:
a chemical isolation chamber;
a deposition chamber formed within the chemical isolation chamber;
a showerhead module having a faceplate and a backing plate, the faceplate including a plurality of inlets which deliver reactor chemistries to a cavity and exhaust outlets radially outward of the inlets which remove reactor chemistries from the cavity; and
at least one conductance control assembly, which is in fluid communication with the cavity via the exhaust outlets and an evacuation apparatus fluidly connected to the at least one conductance control assembly by one or more evacuation vacuum lines, the at least one conductance control assembly comprising
a fluidic valve free of moving parts, the fluidic valve having a modulating gas portion and a chamber outflow portion in fluid communication with the one or more evacuation vacuum lines, the modulating gas portion configured to direct a stream of modulating gas from a modulating gas supply into a flow of reactor chemistries from the cavity, and wherein the stream of modulating gas modulates flow resistance experienced by the flow of the reactor chemistries from the cavity by directing the stream of the modulating gas into the flow of reactor chemistries from the cavity.

2. The apparatus of claim 1, comprising: a source of purge gas, which is supplied to the cavity to purge the cavity of the reactor chemistries.

3. The apparatus of claim 1, comprising: a substrate pedestal module configured to support a substrate and which moves vertically to close the cavity between the pedestal module and an outer portion of the faceplate, and wherein the at least one conductance control assembly is a plurality of conductance control assemblies, which are evenly spaced circumferentially around the substrate pedestal module.

4. The apparatus of claim 3, wherein each of the plurality of conductance control assemblies is configured to be fluidly connected to two or more exhaust outlets.

5. The apparatus of claim 1, comprising:
a semiconductor substrate; and
wherein at least one of chemical vapor deposition, plasma-enhanced chemical vapor deposition, atomic layer deposition, plasma-enhanced atomic layer deposition, pulsed deposition layer, and/or plasma enhanced pulsed deposition layer is performed on the semiconductor substrate.

6. The apparatus of claim 1, wherein the modulating gas of the fluidic valve is an inert gas.

7. The apparatus of claim 6, wherein the modulating gas portion of the fluidic valve has a modulating inlet, which receives the modulating gas from the modulating gas supply, an inner cavity, at least one inlet and at least one outlet, and wherein the at least one outlet is configured to direct the stream of the modulating gas into the flow of reactor chemistries from the cavity.

8. The apparatus of claim 7, wherein the at least one inlet and the at least one outlet are cylindrical holes within the modulating gas portion of the fluidic valve forming a conduit.

9. The apparatus of claim 1, wherein the modulating gas and the reactor chemistries of the fluidic valve are combined within an exhaust conduit of the modulating gas portion, which is in fluid communication with the one or more vacuum gas lines.

10. The apparatus of claim 1, wherein the exhaust outlets are concentric exhaust outlets.

11. The apparatus of claim 1, wherein the at least one conductance control assembly has a minimum to a maximum conductance range, which has three orders of magnitude.

12. A chemical deposition apparatus, comprising:
a chemical isolation chamber;
a deposition chamber formed within the chemical isolation chamber;
a showerhead module having a faceplate and a backing plate, the faceplate including a plurality of inlets which deliver reactor chemistries to a cavity and exhaust outlets radially outward of the inlets which remove reactor chemistries from the cavity via exhaust passages extending radially from an outer edge of the cavity; and
at least one conductance control assembly, which is in fluid communication with the cavity via the exhaust outlets and an evacuation apparatus fluidly connected to the at least one conductance control assembly by one or more evacuation vacuum lines, the at least one conductance control assembly comprising a ball valve assembly, the ball valve assembly comprising:
a housing having a conical lower portion;
a conduit extending from the conical lower portion of the housing to one or more of the exhaust outlets of the cavity, the conduit having an inlet and an outlet; and
a spherical body configured to fit within the conical lower portion, and wherein the spherical body is configured to block the outlet of the conduit and prevent a flow of the reactor chemistries through the conduit during a dosing step, and to allow the reactor chemistries and a purge gas to flow from the cavity into the one or more evacuation vacuum lines upon exceeding a first pressure and flow rate within the cavity during a purging step by rising upward as a result of the flow of purge gas exceeding the first pressure to provide an opening between a lower surface of the spherical body and the outlet of the conduit.

13. The apparatus of claim 12, comprising: a source of purge gas, which is supplied to the cavity to purge the cavity of the reactor chemistries.

14. The apparatus of claim 12, wherein the housing of the ball valve assembly includes an upper portion, which is in fluid communication with the one or more evacuation vacuum lines.

15. The apparatus of claim 12, wherein the spherical body of the ball valve assembly is configured to block the outlet of the conduit, at or below the first pressure and flow rate within the cavity during the dosing step.

16. The apparatus of claim 12, comprising: a substrate pedestal module configured to support a substrate and which moves vertically to close the cavity between the pedestal module and an outer portion of the faceplate, and wherein the at least one conductance control assembly is a plurality of conductance control assemblies, which are evenly spaced circumferentially around the substrate pedestal module.

17. The apparatus of claim 16, wherein each of the plurality of conductance control assemblies is configured to be fluidly connected to two or more exhaust outlets.

18. The apparatus of claim 12, wherein the spherical body of the ball valve assembly is made of a corrosion resistant material, and wherein the weight and size of the spherical body is configured to lift upward only during purging of the reactor chemistries from the cavity.

19. The apparatus of claim 12, comprising:
a semiconductor substrate; and
wherein at least one of chemical vapor deposition, plasma-enhanced chemical vapor deposition, atomic layer deposition, plasma-enhanced atomic layer deposition, pulsed deposition layer, and/or plasma enhanced pulsed deposition layer is performed on the semiconductor substrate.

20. The apparatus of claim 12, wherein the exhaust outlets are concentric exhaust outlets.

21. The apparatus of claim 12, wherein the at least one conductance control assembly has a minimum to a maximum conductance range, which has three orders of magnitude.

22. A chemical deposition apparatus, comprising:
a chemical isolation chamber;
a deposition chamber formed within the chemical isolation chamber;
a showerhead module having a faceplate and a backing plate, the faceplate including a plurality of inlets which deliver reactor chemistries to a cavity and exhaust outlets radially outward of the inlets which remove reactor chemistries from the cavity; and
at least one conductance control assembly, which is in fluid communication with the cavity via the exhaust outlets and an evacuation apparatus fluidly connected to the at least one conductance control assembly by one or more evacuation vacuum lines, the at least one conductance control assembly comprising a rotary valve, the rotary valve comprising:
an upper rotating plate; and
a lower rotating plate magnetically coupled to the upper rotating plate with the upper rotating plate rotating in atmosphere and the lower rotating plate rotating in vacuum, the lower rotating plate having a plurality of conduits in fluid communication with a plenum between the lower rotating plate and the upper rotating plate, the plenum in fluid communication with the one or more evacuation vacuum lines, each of the plurality of conduits configured to receive reactor chemistries from the cavity from a corresponding evacuation conduit within the showerhead module, which is in fluid communication with one or more of the exhaust outlets.

23. The apparatus of claim 22, comprising: a source of purge gas, which is supplied to the cavity to purge the cavity of the reactor chemistries.

24. The apparatus of claim 22, wherein the upper rotating plate and the lower rotating plate rotate in the same direction.

25. The apparatus of claim 22, wherein each of the plurality of conduits within the lower rotating plate has an inlet on a lower surface and an outlet on an upper surface of the lower rotating plate, and each of the plurality of evacuation conduits also includes an inlet in fluid communication with the cavity and an outlet in fluid communication with the inlets of the lower rotating plate.

26. The apparatus of claim 22, wherein each of the outlets of the lower rotary plate are in fluid communication with an inner cavity, which is in fluid communication with the one or more evacuation gas lines.

27. The apparatus of claim 22, comprising: a substrate pedestal module configured to support a substrate and which moves vertically to close the cavity between the pedestal module and an outer portion of the faceplate, and wherein the at least one conductance control assembly is a plurality of conductance control assemblies, which are evenly spaced circumferentially around the substrate pedestal module.

28. The apparatus of claim 27, wherein each of the plurality of conductance control assemblies is configured to be fluidly connected to two or more exhaust outlets.

29. The apparatus of claim 22, comprising:
a semiconductor substrate; and
wherein at least one of chemical vapor deposition, plasma-enhanced chemical vapor deposition, atomic layer deposition, plasma-enhanced atomic layer deposition, pulsed deposition layer, and/or plasma enhanced pulsed deposition layer is performed on the semiconductor substrate.

30. The apparatus of claim 22, wherein the exhaust outlets are concentric exhaust outlets.

31. The apparatus of claim 22, wherein the at least one conductance control assembly has a minimum to a maximum conductance range, which has three orders of magnitude.

* * * * *